United States Patent
Crawford (10) Patent No.: US 6,697,402 B2
(45) Date of Patent: Feb. 24, 2004

(54) HIGH-POWER PULSED LASER DIODE DRIVER

(75) Inventor: Ian D. Crawford, Longwood, FL (US)

(73) Assignee: Analog Modules, Inc., Longwood, FL (US)

( * ) Notice: Subject to any disclaimer, the term of this patent is extended or adjusted under 35 U.S.C. 154(b) by 0 days.

(21) Appl. No.: 09/908,961

(22) Filed: Jul. 19, 2001

(65) Prior Publication Data

US 2003/0016711 A1 Jan. 23, 2003

(51) Int. Cl.[7] .................................................. H01S 3/00
(52) U.S. Cl. ................................. 372/38.03; 372/38.02
(58) Field of Search .................. 372/38.1, 38.01–38.09, 372/29.013, 29.014, 29.015, 29.016, 25, 33, 34, 36, 50, 82, 83, 92

(56) References Cited

U.S. PATENT DOCUMENTS

| | | | | | |
|---|---|---|---|---|---|
| 4,298,869 A | * | 11/1981 | Okuno | ........................ | 315/300 |
| 4,472,087 A | * | 9/1984 | Elders | ...................... | 405/259.3 |
| 4,472,807 A | * | 9/1984 | Chubb et al. | ............ | 372/38.02 |
| 5,287,372 A | * | 2/1994 | Ortiz | ........................ | 372/38.07 |
| 5,394,415 A | * | 2/1995 | Zucker et al. | ................ | 372/26 |
| 5,661,645 A | * | 8/1997 | Hochstein | ..................... | 363/89 |
| 5,736,881 A | * | 4/1998 | Ortiz | ............................ | 327/175 |
| 5,841,648 A | * | 11/1998 | Mansfield | ..................... | 363/59 |
| 5,936,599 A | * | 8/1999 | Reymond | ..................... | 345/82 |
| 5,966,394 A | * | 10/1999 | Spurr et al. | .................... | 372/34 |
| 6,369,525 B1 | * | 4/2002 | Chang et al. | ................ | 315/291 |
| 6,411,045 B1 | * | 6/2002 | Nerone | ........................ | 363/24 |
| 6,430,064 B1 | * | 8/2002 | Tsuchimoto et al. | .......... | 363/24 |

\* cited by examiner

Primary Examiner—Paul Ip
Assistant Examiner—Tuan Nguyen
(74) Attorney, Agent, or Firm—Gerald E. Linden (57) ABSTRACT

Fast rise time to high currents in a load such as a laser diode array is achieved by connecting an inductor between a power supply and an end of the diode array. A switching element, is connected between the other end of the diode array and ground. A shunt switch is connected across the diode array. When the shunt switch is opened, energy stored in the inductor is suddenly delivered to the diode array. A diode may be connected between the other end of the diode array and the input of the driver. A current monitor may be connected in series with the diode array. An overall system comprises the diode array driver(s) and at least a portion of the power supply-namely, an energy storage capacitor. A value for energy storage capacitor in the power supply may be selected to produce a maximally flat-top pulse shape. A source voltage provided by the power supply may be greater than, substantially equal to, or less than the voltage required by the diode. In use, closing the switching element and closing the shunt switch produces an initial current buildup in the inductor, and opening the shunt switch directs the current built up in the inductor into the diode array. Current flow through the diode array is terminated by subsequently closing the shunt switch. With the shunt switch closed, the switching element may be opened, which will cause the current in the inductor to recirculate within a loop comprising the closed shunt switch, the inductor and the diode connected across the series-connected diode array the coil. Periodically closing the switching element will refresh the recirculating current. Refreshing the current in the inductor for a burst, or very short lead time, may be done by turning on (closing) the switching element for a short time with the shunt switch closed, until the current sensed rises to the desired value.

22 Claims, 5 Drawing Sheets

HIGH-POWER PULSED LASER DIODE DRIVER

TECHNICAL FIELD OF THE INVENTION

The invention relates to laser power supplies and, more specifically to high-current, pulse-mode drivers for laser diodes.

BACKGROUND OF THE INVENTION

Pulsed laser diode drivers are used to generate pulses of current, typically into a series array of lasing diodes. The light output is used for various purposes, such as pumping lasers, or timed illumination. The driver design typically comprises a storage capacitor, the laser diode array, and a pulsed current source, connected in series. When the current source is turned on, energy is drawn from the capacitor through the diode array. The voltage on the capacitor falls, so the current source must have sufficient compliance to continue to operate as voltage falls. For good efficiency, a low voltage loss across the current source is desired, but this requires a large and bulky capacitor to minimize voltage sag.

U.S. Pat. No. 5,287,372 (issued Feb. 15, 1994 to Joseph A. Ortiz, patent hereinafter referred to as "ORTIZ") discloses a quasi-resonant diode drive current source providing a high power pulsed current that drives light emitting diodes and the like. ORTIZ discloses a zero-current-switched full wave quasi-resonant converter that provides a high amplitude pulsed output current for driving light emitting pump diodes used in a solid state diode pumped laser.

In ORTIZ, a resonant buck converter power supply drives the diode array directly. While this is an effective way to drive the diode array, it has the disadvantage in pulsed applications that the power supply must be designed to handle the peak power required by the diode array, despite the fact that the average power required can be substantially lower. As a result, bulky and expensive power supply components must be employed (e.g., capacitors, transformers, coils, switching elements, etc.).

In pulsed laser diode drivers, the rise time of the current is limited by the inductance of the diode. array, cabling, and laser diode driver components. Typically, slow rise times are improved by increasing the driving voltage to help overcome the inductance of the diode array, cabling, and driver components. Unfortunately, in pulsed current sources, additional voltage results in greater power dissipation in the current source after the initial voltage surge across the laser diode is over and the current settles to the steady-state value after the pulse has risen. Again, this requires larger, more bulky and more expensive drive components that can dissipate greater power and withstand the higher voltages.

The buck regulator method described in ORTIZ has poor rise time performance because the switching pulses of the converter must be integrated and regulated with a feed back loop to generate a smooth and controlled output current. This, in turn, is limited by the switching frequency of the buck regulator, which will usually be far too slow to achieve the extremely fast rise times that are often required for pulsed laser applications.

Evidently, there is a need for a pulsed laser diode driver with fast rise time, good efficiency and small size. Such a driver would be particularly useful for applications requiring narrow pulses and high peak power.

BRIEF DESCRIPTION (SUMMARY) OF THE INVENTION

It is therefore a general object of the invention to provide an improved laser diode driver.

It is another object of the invention to provide a pulsed laser diode driver with fast rise time, good efficiency and small size.

It is another object of the invention to provide a laser diode driver which is useful for applications requiring narrow pulses and high peak power.

According to the invention, a diode array driver is connected between a power supply and a diode array. An input of the driver receives power from the power source. An output of the driver delivers power to the diode array. The driver comprises an energy storage inductor between the power supply and an end of the diode array, for storing energy. A switching element, is connected between the other end of the diode array and ground. A shunt switch is connected across the diode array. When the shunt switch is opened, energy stored in the inductor is suddenly delivered to the diode array. A diode may be connected between the other end of the diode array and the input of the driver. A current monitor may be connected in series with the diode array.

The power supply may comprise a voltage source or a current source.

The shunt switch is suitably a saturating-type switch, such as FET, BJT, IGBT or SCR.

The switching element connected between the diode array and ground may be a saturating-type switch (e.g., FET, BJT, IGBT, SCR), or a switched current source.

Means may be provided for returning residual energy stored in the inductor back to the power supply.

A plurality of such drivers may be connected to a single power source for operating a corresponding plurality of diode arrays.

An overall system comprises the diode array driver(s) and at least a portion of the power supply—namely, an energy storage capacitor. A value for the energy storage capacitor in the power supply may be selected to produce a maximally flat-top pulse shape. A source voltage provided by the power supply may be greater than the voltage required by the diode array (load), it may be substantially equal to the voltage required by the load, or it may be less than the voltage required by the load.

The present invention provides a combination of good efficiency, fast rise time to high currents, and is tolerant of lead and laser diode inductances. In addition, the energy storage capacitor is of much smaller size and the circuit is able to be designed for use with a wide range of input voltages.

In use, a first switch is turned on to build up current in the inductor just prior to the laser pulse. During this period, the load (diode array) is shorted out by a second (shunt) switch in series with the first switch. When the desired peak current is reached, the second switch is turned off (opened). Because current flow in an inductor can not change abruptly, the current continues to flow into the load, generating a high voltage, as required, to overcome the reactance of the load and leads. To turn off the pulse, the second switch is turned on, shorting out the load and discharging the lead/load inductance as the falling edge of the pulse. Simultaneously, the first switch is turned off and the energy stored in the series inductor is recycled back into the storage capacitor through a diode.

The benefits/advantages of the invention include:
Current is forced into the load and a voltage is generated automatically to achieve a fast rise time to high currents.

The laser diode array is normally expensive and susceptible to electrical damage.

It is protected by the shunt switch.

Because energy is stored in the series inductor, diode arrays of higher voltage than the power source may be driven, simplifying the power supply requirement.

The switches are saturated and therefore have a much lower loss than a linear current source, resulting in high overall efficiency.

Extra energy stored in the series inductor is recycled back to power source capacitor.

Energy stored in the laser diode/lead inductor is dissipated in the load and used as part of the pulse energy resulting in a very low ringing or negative voltage swing across the diode array, which could otherwise be harmful.

Multiple arrays can be driven from the same power source and capacitor. A separate series inductor for each array allows the current to be controlled independently by the switches associated with that array.

The storage capacitor and its initial voltage may be chosen to create a partial discharge during the pulse. This prevents the current from continuing to build during the period when switch one is on. The value of the capacitor is adjusted for the flattest pulse-top if the source voltage is higher than the diode array voltage. If the source voltage is less than the diode array voltage, then the series inductor must provide the current flow during the pulse and be sized accordingly.

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawings. The drawings are intended to be illustrative, not limiting. Although the invention will be described in the context of these preferred embodiments, it should be understood that it is not intended to limit the spirit and scope of the invention to these particular embodiments.

Often, similar elements throughout the drawings may be referred to by similar references numerals. For example, the element 199 in a figure (or embodiment) may be similar or analogous in many respects to an element 199A in another figure (or embodiment). Such a relationship, if any, between similar elements in different figures or embodiments will become apparent throughout the specification, including, if applicable, in the claims and abstract. In some cases, similar elements may be referred to with similar numbers in a single drawing. For example, a plurality of elements 199 may be referred to as 199A, 199B, 199B, etc.

The structure, operation, and advantages of the present preferred embodiment of the invention will become further apparent upon consideration of the following description taken in conjunction with the accompanying drawings, wherein.

DETAILED DESCRIPTION OF THE INVENTION

Figure 1:
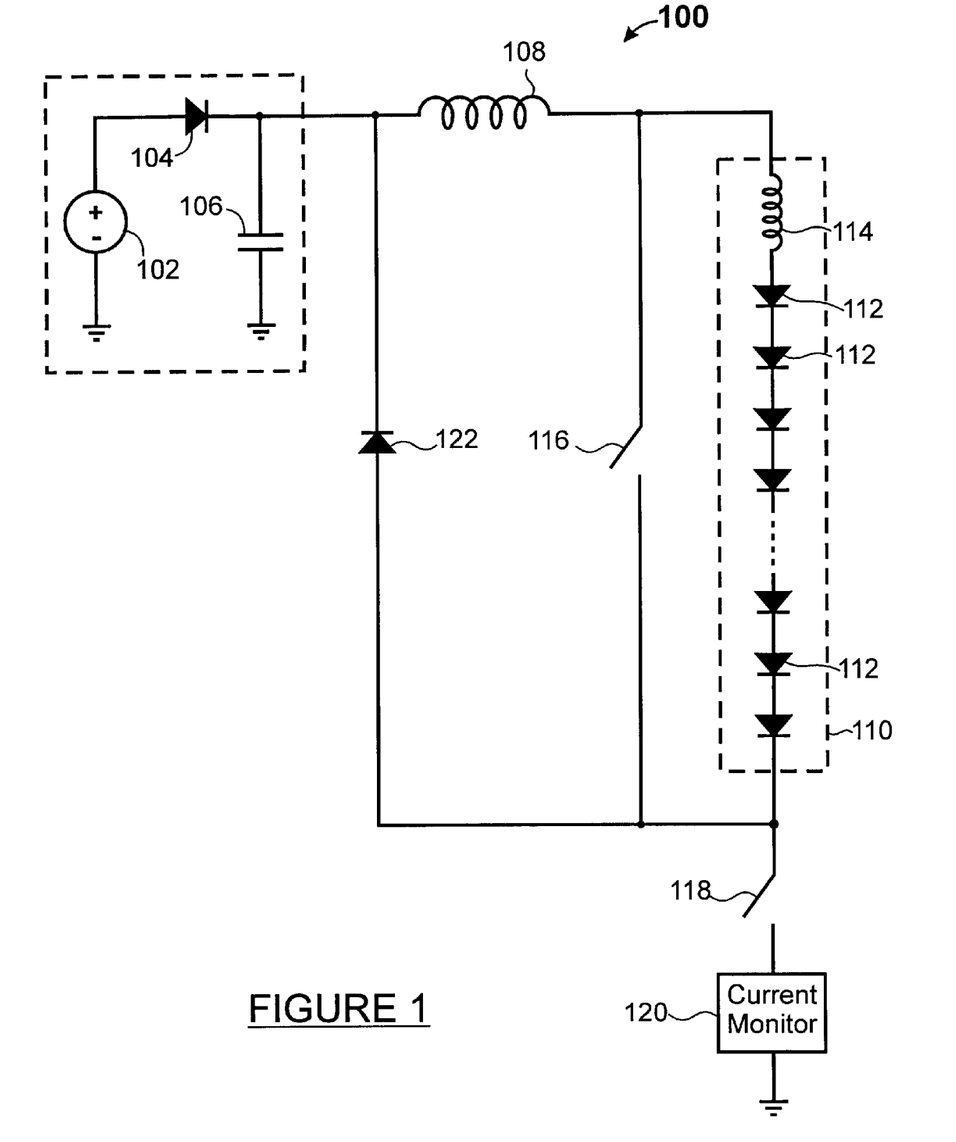
FIG. 1 is a schematic diagram of an embodiment of a high-power pulsed laser diode driver, according to the invention.

FIG. 1 is a schematic diagram of an embodiment of a diode array driver 100, according to the invention. A storage capacitor 106 is charged to a desired voltage by a voltage source 102 and a diode 104. For the purposes of the present invention, the capacitor 106, voltage source 102 and diode 104 may be considered to be a power supply (as indicated by the dashed line). In light of the following description of the remainder of the circuit of FIG. 1, those of ordinary skill in the art will understand that any suitable type of power supply arrangement can be employed. It will, however, become apparent that an integrated system comprising both the driver and at least the storage capacitor of the power supply is advantageously supplied as a single unit, for driving an array of laser diodes.

A key feature of the invention is that a series inductor 108 is connected between the capacitor 106 and one end a load, which is a diode array 110. The diode array 110 comprises a plurality of series-connected laser diodes 112. Inductance associated with the diode array 110 and its wiring are represented in the figure as an equivalent series load inductance 114. The series inductor 108 has a much higher inductance value than the load inductance 114 of the diode array 110.

A switching element ("grounding switch") 118 is connected between another end of the diode array 110 and ground. In FIG. 1, a current monitor 120 is shown in series with the switch 118. Since the impedance of the current monitor 120 is very low, it may be viewed as a "virtual" ground connection. Typically, a current monitor (e.g., 120) is a very low-value resistance across which a small voltage represents the amount of current flowing therethrough. Those of ordinary skill in the art will understand that the current monitor 120 may be inserted at any suitable point in the circuit of FIG. 1 where the current flowing through the series inductor 108 and the diode array 110 may be measured. Other means, such as a Hall-effect sensor may be used.

A "shunt" switch 116 is connected across the diode array 110. When the shunt switch 116 is closed, the diode array (load) is effectively shorted out. A diode 122 is connected across the series combination of the diode array 110 and the series inductor 108.

The grounding switch 118 and shunt switch 116 illustrated in FIG. 1 are each intended to be generally representative of any suitable circuit element capable of switching current in response to an electrical signal, such as a FET (Field Effect Transistor), BJT (bipolar junction transistor), IGBT (Insulated Gate Bipolar Transistor) or SCR (Silicon Controller Rectifier). Those of ordinary skill in the art will understand the suitability and applicability of these and other electronic devices as "switches" in the context of the present invention.

Prior to initiating a current pulse through the diode array 110, the grounding switch 118 and the shunt switch 116 are both closed, thereby shorting out the load and effectively connecting the series inductor 108 between the capacitor 106 (power supply output) and ground. During this time, current builds up in the series inductor 108 according to the well-known equation:

$$i_L = i_0 + \frac{1}{L}\int v \cdot dt$$

where:

| | |
|---|---|
| $i_L$ | is the current in the inductor |
| $i_0$ | is the initial current in the inductor |
| L | is the inductance in Henries |
| v | is the time varying voltage across the inductor, and |
| t | is time |

For a constant voltage across the inductor, this becomes:

$$i_L = \frac{v \cdot t}{L}$$

The current monitor 120 monitors this current. When the current monitor indicates that the current has reached a desired level, the shunt switch 116 is opened. As a result, the voltage across the diode array 110 immediately jumps up to the level required to rapidly force the current from the series inductor 108 through the diode array 110. This results in a very short pulse rise time. To end the pulse, the shunt switch 116 is once again closed, quickly dissipating the current in the diode array 110 in a closed loop that includes the shunt switch 116 and the diode array 110. If at the same time, the grounding switch 118 is opened, the current in the series inductor 108 circulates through a closed loop comprising the series inductor 108, the shunt switch 116 and the diode 122.

In very high pulse rate applications, a substantial portion of the energy stored in the series inductor 108 may not have completely dissipated at the end of the pulse (when the shunt switch 116 is closed). Due to relatively low impedance of the circuit loop comprising the series inductor 108, the shunt switch 116 and the diode 122, with the grounding switch 118 open this energy will recirculate within the aforementioned loop as a loop current, dissipating slowly. This current can be "refreshed" to a desired level by periodically briefly closing the grounding switch 118. This energy storage capability further reduces the requirements on the power supply, permitting smaller size and cost.

Those of ordinary skill in the art will understand that after the initial desired series inductor current level has been reached, it can be maintained for a relatively long period of time by opening the grounding switch 118 and keeping the shunt switch 116 closed. This will keep the series inductor current re-circulating within the aforementioned loop. Periodic, short "maintenance" closures of the grounding switch 118 can be employed to "refresh" the series inductor current to its desired level as it slowly decays due to losses in the loop components.

Power losses in the diode array driver 100 of the present inventive technique are kept small by using simple saturating switches (116, 118) rather than linear current sources. This results in higher overall efficiency than that of many prior-art techniques.

Those of ordinary skill in the art will understand that there are a variety of predictable, repeatable factors that combine to determine the current in the series inductor 108 and that the desired current level can be set by manipulating one or more of these factors. Among the factors that determine the current in the series inductor are:

power supply voltage;
power supply impedance;
storage capacitor value;
equivalent series impedance of the circuit path comprising the series inductor, the shunt switch, the grounding switch and the current monitor; and
duration of grounding switch closure.

Because the present inventive technique stores energy in the series inductor 108, diode arrays of higher voltage than the power source (102, 104, 106) may be driven, thereby simplifying the power supply requirement.

The storage capacitor 106 and its initial voltage may be chosen to create a partial discharge during the pulse. This prevents the current from continuing to build during the period when the grounding switch 118 is on. The value of the capacitor 106 can be adjusted to provide the flattest pulse-top if the source voltage is higher than the voltage required by the diode array 110. If the source voltage is less than the voltage required by the diode array 110, then the series inductor 108 must provide the current flow during the pulse and be sized accordingly. If the source voltage is substantially equal to the voltage required by the diode array 110, the steady-state current through the diode array 110 can be determined by the source voltage.

A significant advantage of the present inventive techniques is that by "forcing" current into the load (diode array 110), extremely fast rise times can be achieved to very high current levels without a need for a high-voltage power supply. As a result, relatively smaller and less expensive components can be employed. Another advantage of this technique is that the power supply need only be designed for the average power to the load, increasing efficiency and further reducing size and cost.

Generally speaking, laser diode arrays are quite expensive and are relatively susceptible to electrical damage. An advantage of the present invention is that the shunt switch 116 protects the diode array 110 when it is closed. Further, because energy stored in the diode array inductance 114 is dissipated in the load and used as part of the pulse energy, there is very little ringing or negative voltage swing across the diode array 110. Such swings can be destructive to the diode array 110. The present inventive technique also protects the diode array 110 by substantially eliminating those swings.

Figure 2:
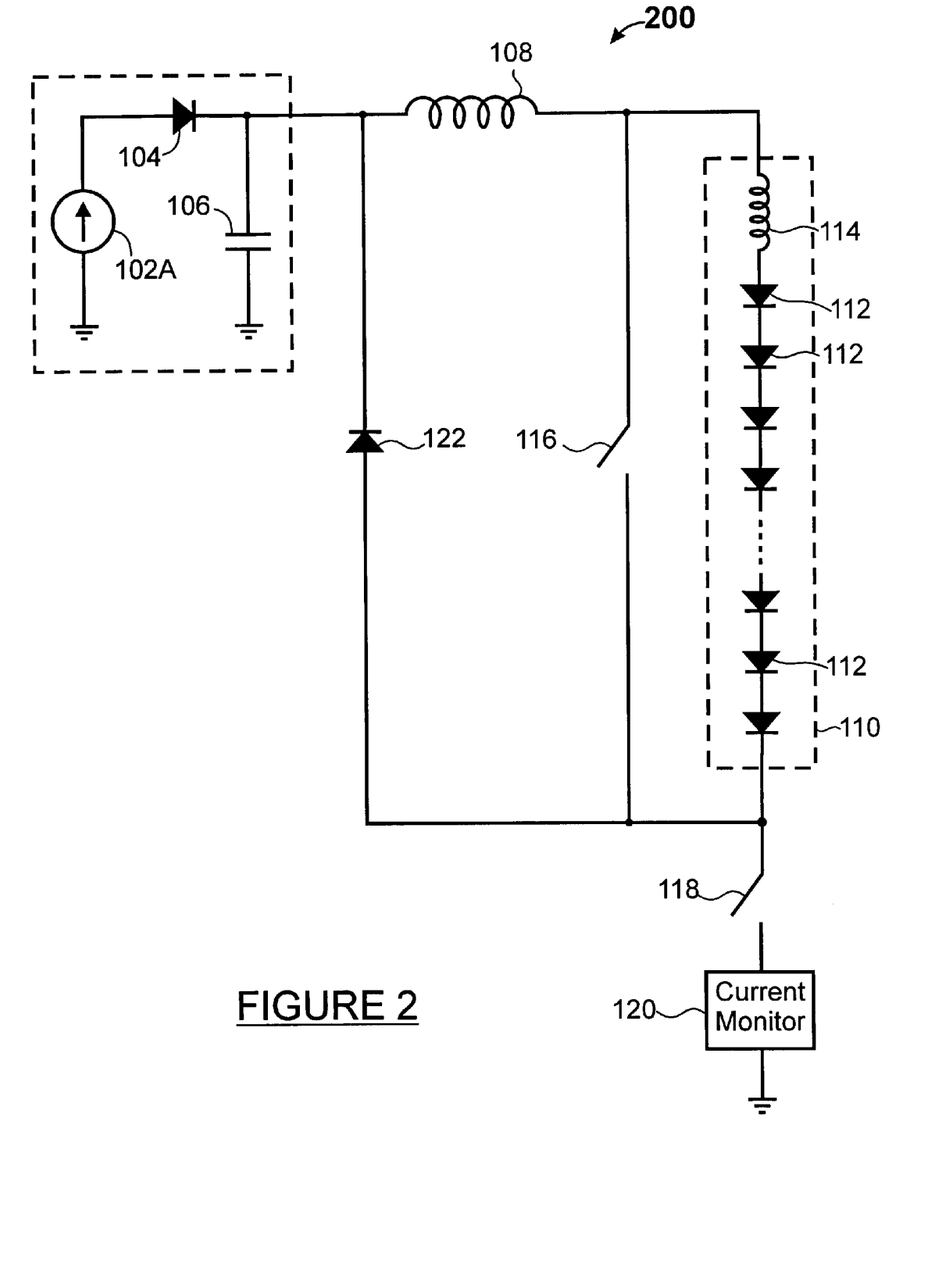
FIG. 2 is a schematic diagram of an alternate embodiment of a high-power pulsed laser diode driver, according to the invention.

FIG. 2 is a schematic diagram of another embodiment of a diode-array driver 200, according to the present invention, similar to the diode array driver 100 described hereinabove with respect to FIG. 1, but wherein the voltage source 102 has been replaced with a current source 102A. The operation of the diode array driver 200 is very similar to that of the diode array driver 100, except that the current source 102A determines the current in the series inductor 108. In most applications, the current in the series inductor 108 can be built up relatively slowly as compared to the duration of the pulse applied to the diode array 110, so relatively lower power supply voltages can be employed. In such applications it is anticipated that the current source 102A will saturate, effectively acting as a voltage source until the current in the series inductor 108 nears its target current, after which time the current source 102A un-saturates and sets/limits the current. Because the current source can supply all of the current required by the diode array 100, the capacitor 106 can be made very small. The series inductor 108 provides any high voltage required to overcome the diode array's series inductance 114. As a result, lower supply voltages can be employed in the design of the current source, reducing bulk and cost and increasing efficiency.

Figure 3:
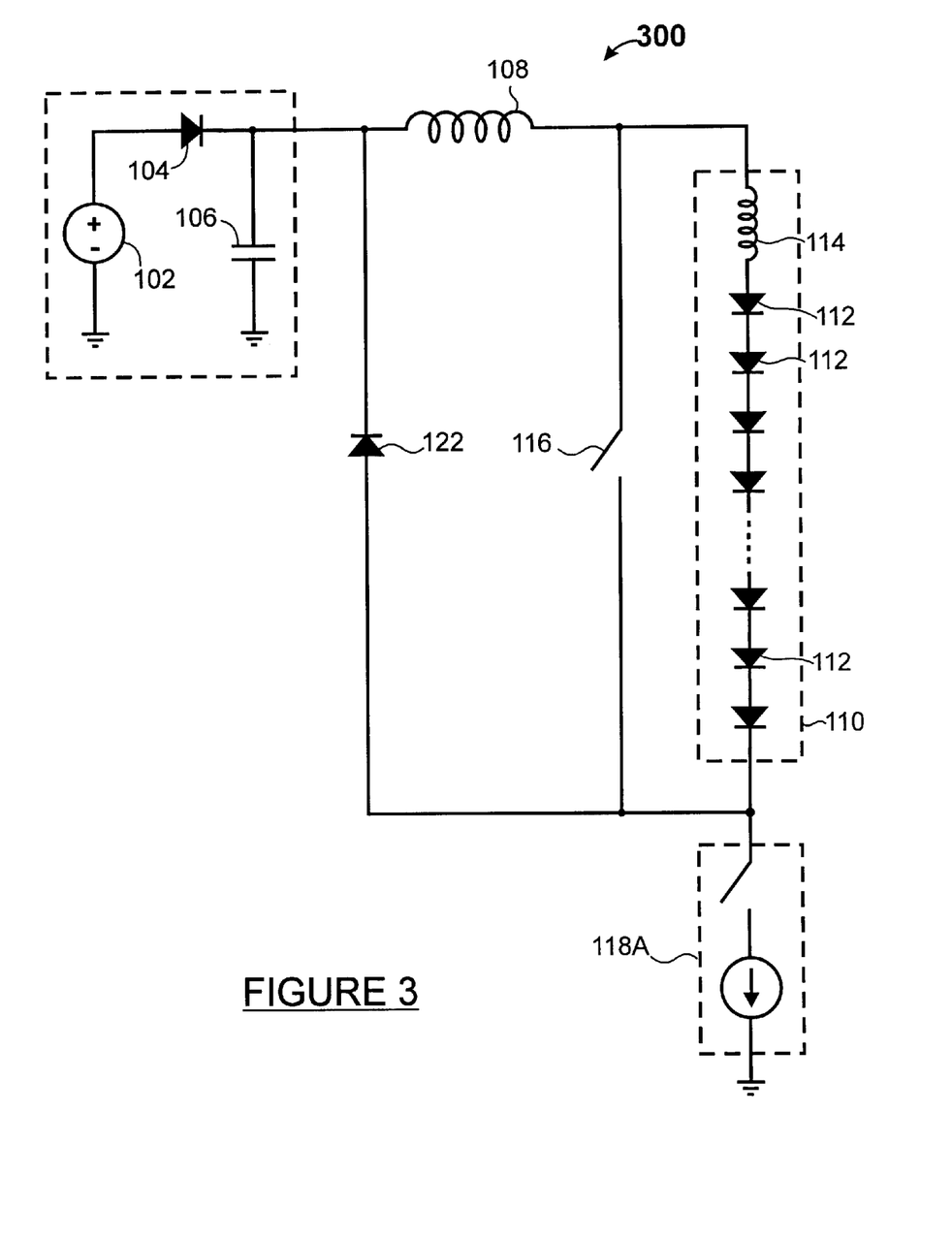
FIG. 3 is a schematic diagram of an alternate embodiment of a high-power pulsed laser diode driver, according to the invention.

FIG. 3 is a schematic diagram of another embodiment of a diode-array driver 300, according to the present invention, similar to the diode array driver 100 described hereinabove with respect to FIG. 1, but wherein the grounding switch 118 and current monitor 120 have been replaced with a switched current source 118A. The operation of the diode array driver 300 is very similar to that of the diode array driver 100, except that the current source 118A determines the current in the series inductor 108. As in the diode array driver 200 of FIG. 2, the series inductor 108 provides any high voltage required to overcome the diode array's series inductance 114. As a result, voltages across the current source 118A are reduced. This approach has the above-described advantages, but has a disadvantage of higher power dissipation in the current source 118A, as compared to using a saturating switch (e.g., 118).

Figure 4:
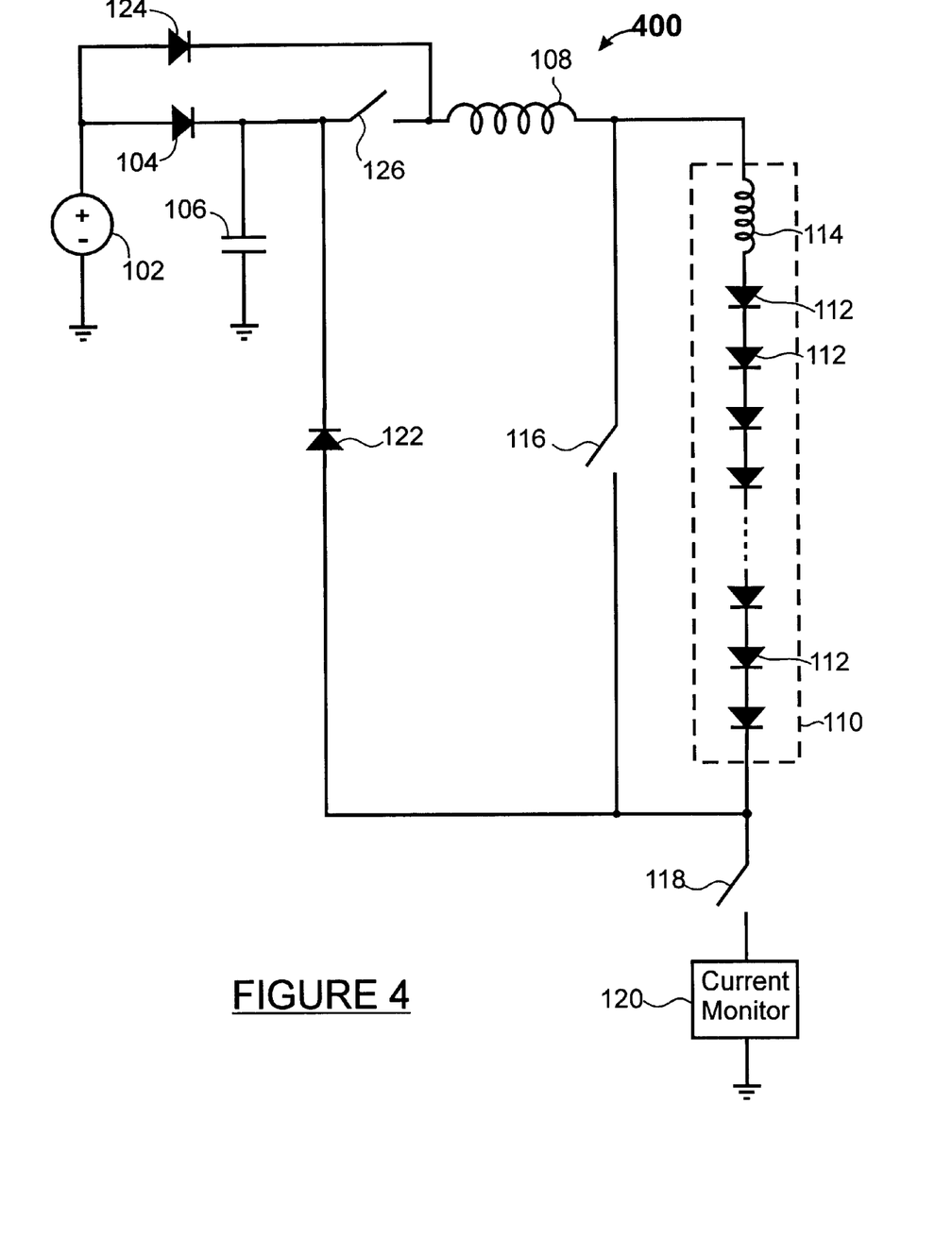
FIG. 4 is a schematic diagram of an alternate embodiment of a high-power pulsed laser diode driver, according to the invention.

FIG. 4 is a schematic diagram of another embodiment of a diode-array driver 400, according to the present invention. The diode array driver 400 is similar to the diode array driver 100 described hereinabove with respect to FIG. 1, but with the addition of a series switch 126 inserted before the series inductor 108 and a diode 124 connected from the voltage source 102, around the switch 126, to the series inductor 108. With the series switch 126 closed, the diode array driver 400 behaves the same as the diode array driver 100 of FIG. 1. However, the diode array driver 400 of FIG. 4 makes provision for returning residual energy stored in the series inductor 108 to the capacitor 106. This is accomplished by opening the grounding switch 118, opening the series switch 126 and closing the shunt switch 116. Via the diode 124, the minimum voltage at the series inductor is raise to (substantially) the voltage present at the voltage source. The stored current in the series inductor then flows through the closed shunt switch 116 and the diode 122 into the capacitor 106, increasing the voltage across the capacitor 106. Alternatively, the grounding switch 118 can remain closed (or, equivalently, can simply be done away with altogether), and the series switch 126 may be used to control the current.

The circuit of FIG. 4 is intended to be representative of any suitable scheme for returning energy stored in the series inductor 108 to the capacitor 106. Those of ordinary skill in the art will understand that there are alternative circuit arrangements for accomplishing substantially the same result, and any such scheme is intended to be embraced within the scope and intent of the present invention.

Figure 5:
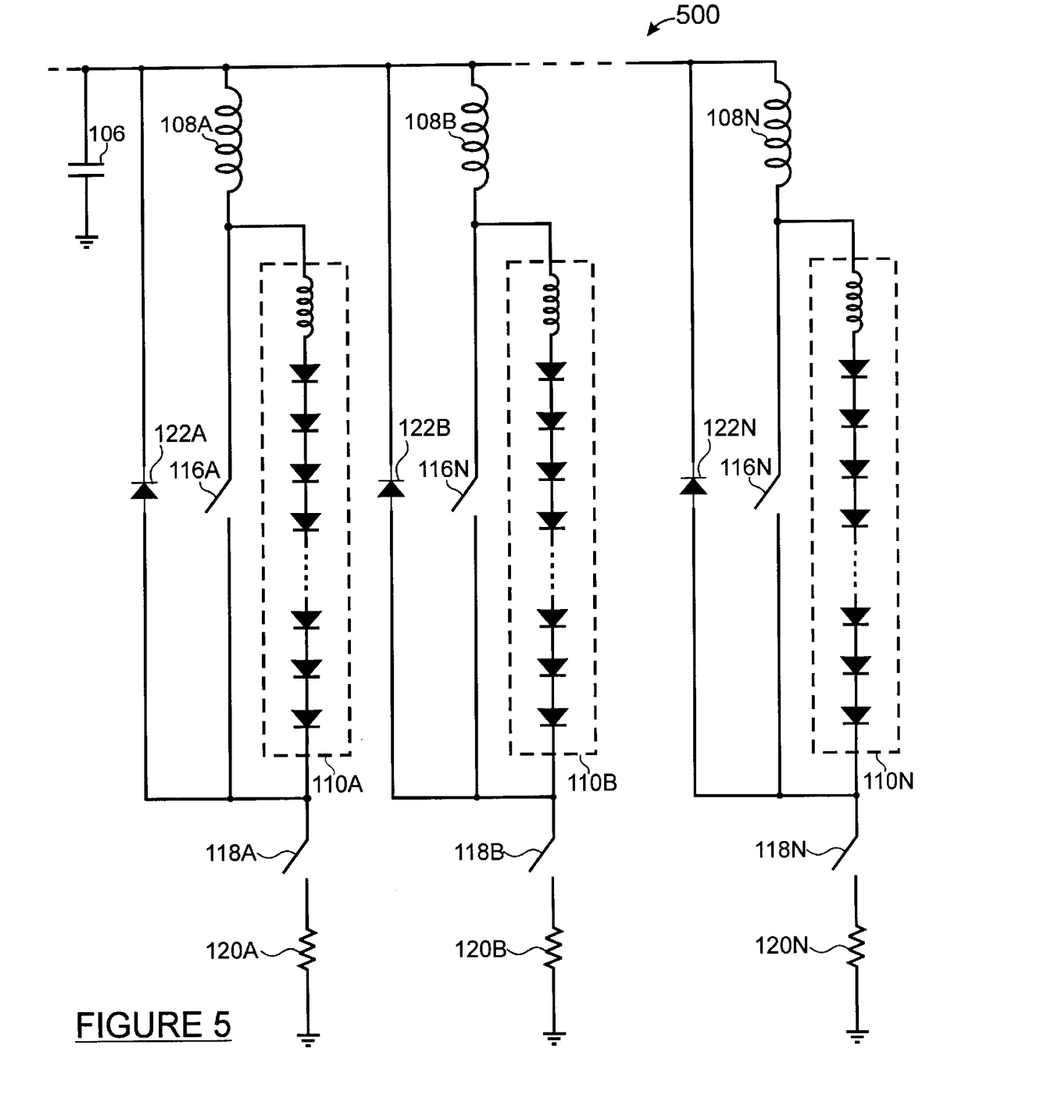
FIG. 5 is a schematic diagram of a high-power pulsed laser diode driver for multiple, independent diode arrays utilizing a single common power supply, according to the invention.

An advantage of the present inventive technique is that it is readily adapted to driving multiple diode arrays, independently. FIG. 5 is a schematic diagram of a multiple diode array driver 500 whereby multiple diode arrays 110A, 110B, ..., 110N are all driven by a common power supply (not shown), represented by common connection to a storage capacitor 106. (There may be only one storage capacitor 106 for the plurality of diode arrays.) Each diode array (110A, 110B, ..., 110N) has its own series inductor (108A, 108B, ..., 108N), shunt switch (116A, 116B, ..., 116N), grounding switch (118A, 118B, ..., 118N), diode (122A, 122B, ..., 122N), and current monitor (120A, 120B, ..., 120N). For the purposes of FIG. 5, the current monitors (120'x') are represented as small-value resistors. If the circuit timing can be manipulated such that it is not necessary to close more than one grounding switch (118'x') at a time, then the grounding switches (118'x') can be commonly connected to a single current monitor. Operation of the individual arrays 110'x' and their respective switches and diodes is identical to that described hereinabove for single arrays with respect to FIG. 1.

It will readily be understood by those of ordinary skill in the art that any of the techniques shown and described hereinabove with respect to FIGS. 1–4 can be readily adapted to multiple diode arrays. For example, the technique of returning stored series inductor energy to the capacitor (e.g., of FIG. 4) is readily adapted to the multi-array driver of FIG. 5 by adding a switch and diode to the drive circuitry for each diode array.

The present inventive technique provides a combination of good efficiency, fast rise time to high currents, and is tolerant of lead and laser diode inductances. In addition, the energy storage capacitor is of much smaller size than is required by prior-art techniques and the circuit can be designed for use with a wider range of input voltages Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein.

For example, refreshing the current in the inductor for a burst, or very short lead time, may be done by turning on (closing) the switch (e.g., 118) for a short time with the shunt switch (e.g., 116) closed, until the current sensed rises to the desired value. One of ordinary skill in the art would readily understand the implementation of such an arrangement, based on the descriptions of the invention set forth hereinabove.

What is claimed is:

1. A pulsed laser diode driver for driving a laser diode array having a first end and a second end, said laser diode array driver comprising:

an input for receiving power from an output of a power supply, said power supply comprising a voltage source;

an inductor for storing energy and for providing power, said inductor having a first terminal connected to the input of the diode array driver and a second terminal connected to the first end of the laser diode array;

a switching element connected between the second end of the laser diode array and ground; and a shunt switch connected to the first end and to the second end of the laser diode array, for causing current to build up in the inductor when the shunt switch is closed and for causing the stored energy in the inductor to be delivered to the diode array when the shunt switch is opened.

2. A diode array driver, according to claim 1, wherein: the switching element is selected from the group consisting of saturating switch and switched current source.

3. A diode array driver, according to claim 1, further comprising:

a diode connected between the second end of the diode array and the input.

4. A diode array driver, according to claim 1, further comprising:

means f or returning residual energy stored in the inductor back to the power supply.

5. A pulsed laser diode driver system for driving a laser diode array having a first end and a second end, said laser diode array driver system comprising:

a power supply comprising a voltage source and having an output;

an energy storage capacitor connected to the output of the power supply and ground;

an inductor having a first terminal connected to the output of the power supply and having a second terminal connected to the first end of the laser diode array;

a switching element connected between the second end of the laser diode array and ground;

a shunt switch connected to the first end and to the second end of the laser diode array for causing current to build up in the inductor when the shunt switch is closed, and for causing the stored energy in the inductor to be delivered to the diode array when the shunt switch is opened; and a first diode connected between the second end of the laser diode array and the output of the power supply.

6. A driver system, according to claim 5, wherein:
the switching element is a saturating switch.

7. A driver system, according to claim 6, wherein:
the saturating switch comprises an electronic device selected from the group consisting of FET, BJT, IGBT and SCR.

8. A driver system, according to claim 5, wherein:
the shunt switch comprises an electronic device selected from the group consisting of FET, BJT, IGBT and SCR.

9. A driver system, according to claim 5, further comprising:
means for directing unused energy stored in the inductor back into the energy storage capacitor.

10. A driver system, according to claim 5, further comprising:
a series switch connected between the output of the power supply and the inductor.

11. A method of generating pulses of current for driving a laser diode array having a first end and a second end, said method comprising:
providing a diode array driver comprising:
an input for receiving power from a power supply comprising a voltage source;
an inductor for storing energy and for providing power, said inductor having a first terminal connected to the input and a second terminal connected to the first end of the diode array;
a switching element connected between the second end of the diode array and ground; and
a shunt switch connected to the first end and to the second end of the diode array, for causing the stored energy to be delivered to the diode array;
closing the switching element and closing the shunt switch to produce an initial current buildup in the inductor; and
opening the shunt switch to direct the current built up in the inductor into the diode array.

12. A method of driving a laser diode array according to claim 11, further comprising:
closing the shunt switch after opening it to terminate current flow through the diode array.

13. A method of driving a laser diode array according to claim 11, further comprising:

prior to opening the shunt switch and after building up an initial current in the inductor:
opening the switching element to cause the current in the inductor to recirculate within a loop comprising the closed shunt switch, the inductor and the diode.

14. A method of driving a laser diode array according to claim 13, further comprising:
after opening the switching element:
simultaneously closing the switching element and opening the shunt switch to cause the recirculating current to be direct through the diode array.

15. A method of driving a laser diode array according to claim 13, further comprising:
periodically closing the switching element to refresh the recirculating current.

16. A method of driving a laser diode array according to claim 13, further comprising:
refreshing the current in the inductor by closing the switching element for a short time with the shunt switch closed, until the current sensed rises to a desired value.

17. A method of driving a laser diode array according to claim 11, further comprising:
redirecting unused energy in the inductor into an energy storage capacitor in the power supply.

18. A method of driving a laser diode array according to claim 11, further comprising:
selecting a value for an energy storage capacitor in the power supply to produce a maximally flat-top pulse shape;
wherein:
a source voltage provided by the power source is greater than the voltage required by the load.

19. A method of driving a laser diode array according to claim 11, wherein:
a source voltage provided by the power source is substantially equal to the voltage required by the load, and determines the steady-state current through the diode array.

20. A method of driving a laser diode array according to claim 11, wherein:
a source voltage provided by the power source is less than the voltage required by the load, and current to the diode array is provided by the series inductor.

21. A diode array driver, according to claim 1, wherein the power supply further comprises a first diode between the voltage source and the output of the power supply, a capacitor connected between the output of the power supply and ground, the diode array driver further comprising;
a series switch connected between the output of the power supply and the first terminal of the inductor; and
a second diode connected between the voltage source and the first terminal of the inductor .

22. A driver system, according to claim 5, further comprising
a series switch connected between the output of the power supply and the first terminal of the inductor; and
a second diode connected from the voltage source to the first terminal of the inductor.

* * * * *